United States Patent [19]
Brogle et al.

[11] Patent Number: 5,610,434
[45] Date of Patent: Mar. 11, 1997

[54] MESA SEMICONDUCTOR STRUCTURE

[75] Inventors: James J. Brogle; Harold P. Davis, both of Cork City; Jean-Michel Guillot, Cloyne; Michael Korwin-Pawlowski, Cork City, all of Ireland

[73] Assignee: General Instrument Corporation of Delaware, Hatboro, Pa.

[21] Appl. No.: 554,749

[22] Filed: Nov. 7, 1995

[51] Int. Cl.$^6$ .......................... H01L 21/302; H01L 29/74
[52] U.S. Cl. .......................... 257/619; 257/620; 257/623
[58] Field of Search .......................... 257/618, 620, 257/622, 623, 625, 626, 619

[56] References Cited

U.S. PATENT DOCUMENTS

| | | | |
|---|---|---|---|
| 3,553,536 | 1/1971 | Neilson | 317/235 |
| 4,220,963 | 9/1980 | Rumennik | 357/55 |
| 4,259,682 | 3/1981 | Gamo | 257/620 |
| 5,313,092 | 5/1994 | Tsarata et al. | 257/620 |

FOREIGN PATENT DOCUMENTS 55-26670  2/1980  Japan ..................... 257/620

Primary Examiner—Donald L. Monin, Jr.
Attorney, Agent, or Firm—Irwin Ostroff

[57] ABSTRACT

Mesa diodes of improved mechanical properties are formed by providing a central depression in the regions of the chip from which the mesa is formed before the diffusion step that forms the rectifying junction in the mesa. In symmetric diodes, symmetric depressions are formed on both the top and bottom surfaces of the chip.

8 Claims, 6 Drawing Sheets

MESA SEMICONDUCTOR STRUCTURE

FIELD OF THE INVENTION

This invention relates to semiconductor devices that include a mesa structure and to a process for the manufacture of such devices.

BACKGROUND OF THE INVENTION

A popular technology in the construction of silicon devices, particularly devices that include at only a few components, as contrasted with integrated circuits, is the mesa technology. This technology is characterized by the use of a mesa structure that includes one or more active junctions of the device that terminate on side walls of the mesa. Typically, a junction is formed in the mesa by diffusing an appropriate donor or acceptor impurity into a surface layer of a silicon wafer and then etching the surface to form a moat of a depth deeper than that of the diffused layer for forming a mesa that includes a diffused layer that forms a p-n junction that terminates on the side wall of the mesa. Typically, the sidewalls of the mesa where the junction terminates are later covered with one or more passivating layers, usually either of silicon nitride, an oxide of silicon, semi-insulating polysilicon, or a silicate glass.

Mesa devices that are formed in this way are usually two-terminal devices that serve a variety of functions with the area of the junction typically reflecting the use the device is to serve. Mesa diodes have been used as power rectifiers in which case the junctions have a relatively large area or as zener diodes, either unidirectional or bidirectional, or as transient voltage suppressor devices, in Which case the junctions are typically of relatively smaller area.

The mesa technology is popular because it has a number of advantages. It is a relatively simple process that results in low manufacturing costs. It is well adapted for easy manufacture of devices with a high breakdown voltage, which is largely determined by the resistivity of the wafer in which the mesa junction is formed. Additionally, mesa devices are easy to passivate.

For most of its uses, it is important that the mesa device exhibit a low series resistance when in a low resistance state. A low series resistance is advantageous to achieve a low voltage drop during forward conduction, a high clamping voltage or surge current capacity, and fast turn-on and reverse recovery speeds.

To achieve a low series resistance, it is generally important to work with relatively thin semiconductive wafers. When one works with thin wafers whose thickness is further reduced in the areas of the moats or trenches used to define the mesa, a consequence is a wafer that is prone to breaking during manufacture with resultant low yields.

It is known to increase the mechanical strength or ruggedness of mesa-type devices by providing thickened peripheral regions as is discussed in U.S. Pat. Nos. 3,553, 536 and 4,220,963, but at the expense of increased complexity and cost of manufacture. The present invention represents an improved approach.

SUMMARY OF THE INVENTION

The present invention utilizes a novel geometry for the mesa structure that makes it possible to etch a shallower moat than in conventional structures but still to achieve a low series resistance. This geometry involves thinning selectively a central region of the portion that will serve as the mesa structure before the diffusion step that creates the p-n junction so that a shallower moat can be used to form a satisfactory mesa.

By this expedient, after the diffusion step there results a mesa structure that has a relatively thick periphery where the junction is relatively shallow, and a thinned central region where the junction is relatively deep with respect to the original surface that remains the surface of the peripheral region. This makes it feasible to limit the depth of the moat that needs to be etched to insure that the diffused junction terminates in a side wall of the mesa. This permits leaving more of the original thickness of the wafer in the area of the moat. For a diode that is to include a double mesa structure, the thinning is done on both front and back surfaces of the wafer to form a central region in the wafer of reduced thickness surrounded on a top and bottom by a region of increased thickness where the one or both p-n junctions intersect the side walls.

In accordance with one embodiment, the present invention is a semiconductive device that includes a silicon chip that includes a bulk portion and a mesa portion, the mesa portion including a central depressed region of reduced thickness. A diffused layer that follows the contour of the top surface of the mesa forms a junction in the mesa whose edges terminate at the side walls of the mesa. Other embodiments include chips that have another depression opposite the first depression to form symmetric mesas in the chip.

From another aspect, the invention is a process for making the novel devices. The process involves forming a depression either in one surface or both surfaces of a wafer, forming a diffused layer on either one or both surfaces that follows the contour of the depressed surface, and then forming a moat in either one or both surfaces around the depression to form a mesa on either one or both surfaces, such that the diffused layer on either one or both surfaces terminates in the side walls of the mesa. Advantageously, the starting wafer has been cut so that its top and bottom surfaces lie on <100> crystal planes of the wafer to provide sloped walls to the depressions.

Moreover, in accordance with other embodiments, the bottom surface of the chip is also etched to have a surface topology that is essentially a mirror image of the topology of the top surface of the chip.

Viewed from one perspective the present invention is a semiconductive device which comprises a semiconductive chip that includes a bulk portion of a first conductivity type and a mesa portion on a front surface of the bulk portion. The mesa portion includes a central depressed region of a first thickness and a peripheral portion of a second greater thickness. A first diffused layer is in the mesa portion and follows essentially the contour of the top surface of the mesa portion and has edges that terminate at the side walls of the mesa portion.

Viewed from another perspective, the present invention is a semiconductive device which comprises a semiconductive chip having a front and a back surface, and a bulk portion at the back surface and a mesa portion at the front surface, the front and back surfaces each including a central depression, and a diffused layer at the front surface forming a p-n junction that follows essentially the contour of the top surface and whose edges terminate on the side walls of the mesa portion.

Viewed from still another perspective, the present invention is a semiconductive device which comprises a semiconductive chip having a central bulk portion and mesa portions on the front and back surfaces of said central bulk portion with central depressions in the front and back surfaces, first and second diffused layers on the surfaces of said mesa portions, and separate electrode connections to said first and second diffused layers Viewed from still another perspective, the present invention is a method for making a semiconductive device using the following steps. A first step of preparing a silicon wafer having a bulk portion with planar front and back surfaces; a second step of etching a portion of the front surface of the wafer to form a depression defining a thinned central region; a third step of diffusing an impurity into the front surface of the wafer including the thinned central region to form a diffused in layer in the front surface that forms a p-n junction with the bulk portion; a fourth step of etching a moat on the front surface around the depression for defining a mesa portion that includes a p-n junction whose edges terminate at the side walls of the mesa; and a fifth step of dicing the wafer to form a chip that includes a bulk portion of the wafer and the mesa portion.

The invention will be better understood from the following description taken with the accompanying drying.

It is to be noted that the drawings are not to scale and that some of the reference numbers of the figures which denote analogous elements in the respective figures are the same. In each of the figures important dimensions are shown as A, B, C, and D.

DETAILED DESCRIPTION

Figure 1:
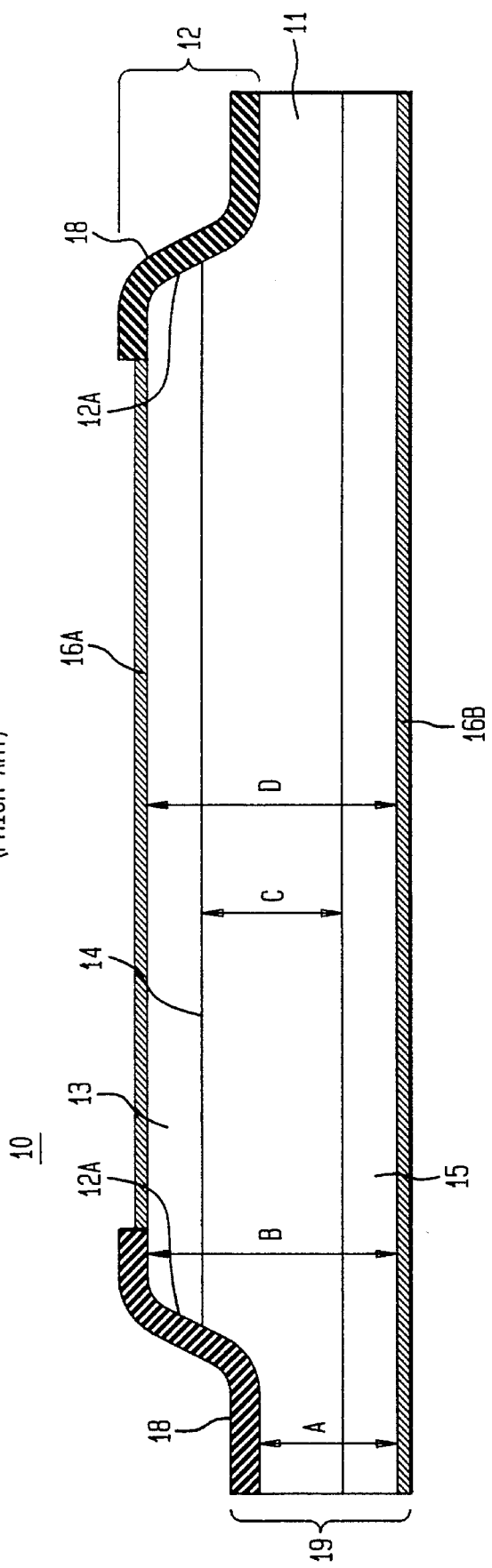
FIG. 1 shows a cross-sectional view of a silicon diode with a mesa structure of the kind typical of the prior art.

Referring now to FIG. 1, there is shown a prior art silicon diode formed on a silicon chip 10. In manufacture, the starting wafer typically is large enough to accommodate many such chips, and many chips are processed in parallel in each wafer. The wafer is subsequently cut up to form individual dice or chips, each housing one or more diode devices. In special instances, typically where the device is to handle very large currents, only a single device is made in each wafer.

In most respects, it will be convenient to describe the invention as though a single device is being made in each wafer.

The silicon chip 10 includes a bulk portion 11 that generally remains in the same state as the starting material of the wafer and that forms the bulk of the chip 10. It typically is of relatively high resistivity material, either n-type or p-type conductivity. As is known, the resistivity of this bulk portion 11 largely determines the breakdown voltage of the diode, the higher the resistivity, the higher the breakdown voltage. The chip 10 includes a mesa portion 12 of reduced cross section that includes a diffused top surface layer 13 which is of the opposite conductivity type than that of the bulk portion 11. The mesa sidewall includes a tapered portion 12A. The layer 13 and bulk potion 11 form a rectifying p-n junction 14 that extends to the side wall of the mesa. A bottom surface of the chip typically includes a diffused surface layer 15 (a contact layer) that is of the same conductivity type but of lower resistivity than the bulk portion 11. The layer 15 facilitates making a low resistance ohmic connection to the bulk portion 11. Conductive layers, typically of a metal, provide electrode connections 16A and 16B to the opposed diffused layers 13 and 15, respectively. A passivating layer 18 of one or more dielectrics extends along the side wall of the mesa portion and generally partly over the edges of a top surface of layer 13 to reduce edge-breakdown effects. The tapered side wall portion 12A facilitates coverage. Typically, the individual chips are separated from the wafer by dicing midway in the moat, leaving a peripheral rim portion 19 to each chip that is thinner than the rest of the chip. Typically the rim portion 19 will be thicker than diffused layer 15 but thinner then the sum of the thicknesses of layers 11 and 15. This tends to result in a thicknesses for the rim region 19 that makes for breakage and lowered yields in manufacture.

Figure 2:
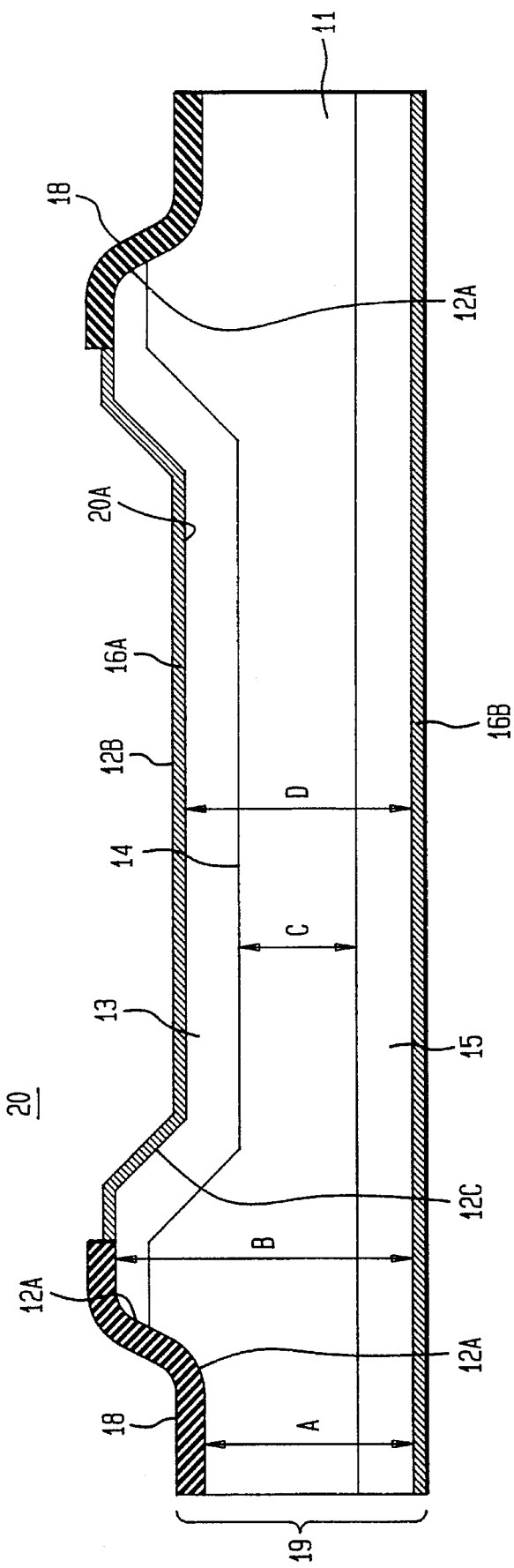
FIG. 2 shows a cross-sectional view of a silicon diode that includes a semiconductive chip with a mesa structure that has a central depression, in accordance with an embodiment of the present invention.

Referring now to FIG. 2, there is shown a chip 20 in accordance with one embodiment of the present invention. Basically the chip 20 differs from chip 10 of FIG. 1 as the result of the formation of a depressed or thinned central region 12B in the wafer 11 before the formation of the rectifying junction 14 so that the contour of the junction 14 follows the contour of the now-depressed top surface 20A of the chip 20. The depression includes a tapered portion 12C to facilitate coverage. However, the junction 14 that is formed by diffused layer 13 still terminates on side walls of the mesa portion of the chip 20. The tapered sidewall 12A facilitates coverage. Because of the central depression (region) 12B, rim region 19 of chip 20 of FIG. 2 generally can be thicker than corresponding rim region 19 of the prior chip 10 of FIG. 1. Accordingly, chip 20 is less likely to break during manufacture.

The process for forming the chip 20 will now be described with reference to FIGS. 6, 7, 8, 9, and 10 that show the chip 20 in various stages of its manufacture into the form shown in FIG. 2.

Figure 6:
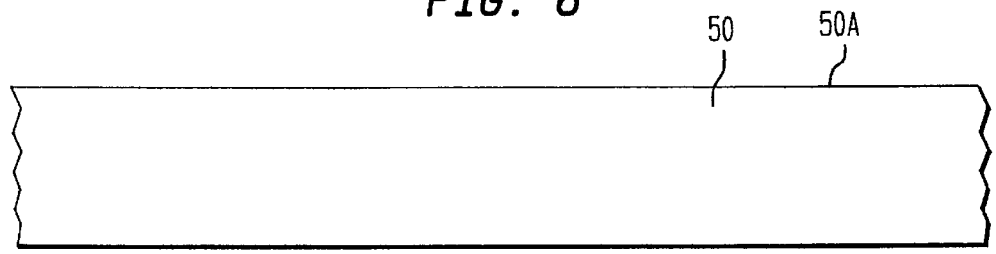
FIGS. 6, 7, 8, 9, and 10 show the embodiment of FIG. 2 absent its electrodes in various stages of its preparation in accordance with a process of the present invention.

FIG. 6 illustrates a portion of a starting wafer 50 in which a single chip 20 of FIG. 2 is formed. Advantageously, the wafer 50 is cut so that a top (front) surface 50A corresponds to a <100> plane that will permit controlled anisotropic etching of the wafer 50, as is desirable, as will be discussed later. For the typical application the starting material is of relatively high resistivity monocrystalline silicon, either n- or p- type conductivity. For purposes of illustration, wafer 50 is assumed to be relatively high resistivity p-type conductivity.

Figure 7:
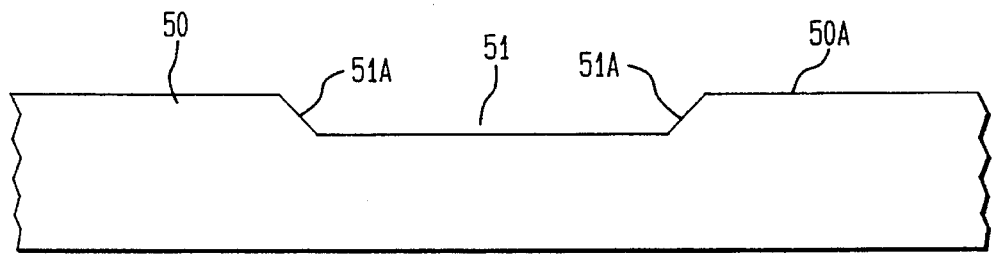

FIG. 7 shows the wafer 50 after the thinning of a central portion by anisotropic wet etching of the top surface 50A to leave a central depression 51 with sloped side walls 51A. Such anisotropic wet etching, as is known in the art, can be achieved for example, by etching a <100> surface with an aqueous solution of potassium hydroxide or ethylenediamine. The etching is localized to the central region by masking the surface regions not to be etched with a photoresist mask, the standard photolithographic technique.

Figure 8:
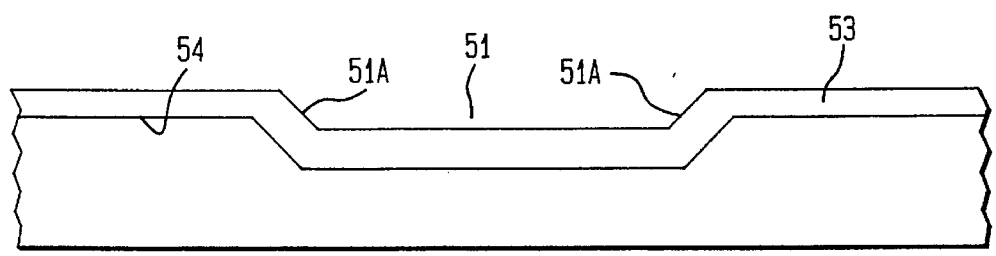

FIG. 8 shows the wafer 50 after the top surface 50A has been exposed to a donor diffusion to form an n-type diffused surface layer 53 that follows the contour of the central depression 51 in the top surface of the wafer to form a rectifying p-n junction 54.

Figure 9:
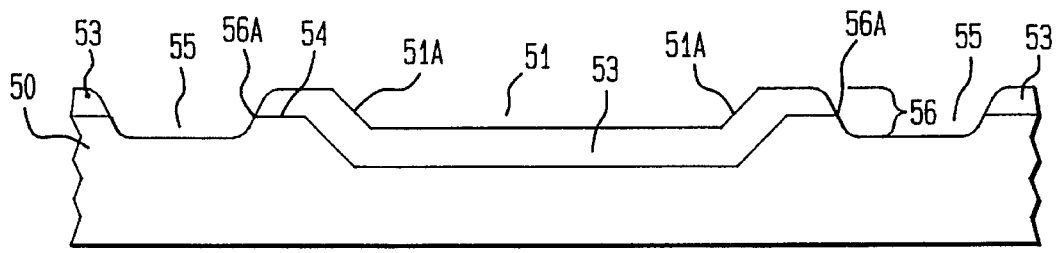

FIG. 9 shows the wafer 50 after there has been formed the moat (or trench) 55 that defines a central mesa 56 within which is included a rectifying junction 54, which terminates on side walls 56B of the mesa defined by the moat 55. Advantageously, the moat 55 is etched isotropically to form side walls 56A of the mesa 56. As mentioned previously, the sloping of the side walls promotes good coverage of any layers deposited thereover. The moat 55 is localized in the usual fashion by masking regions not to be etched, before the wafer 50 is exposed to the wet etchant. The depth of the moat needs to be sufficient that the junction 54 terminates on the side wall 56A of the mesa 56, as is shown. It can otherwise be shallower, equal to, or deeper than the depressed central region 51 of the wafer 50, but generally the depth would be adjusted to leave a rim portion that is thicker than would be usual in the absence of the central depression.

Figure 10:
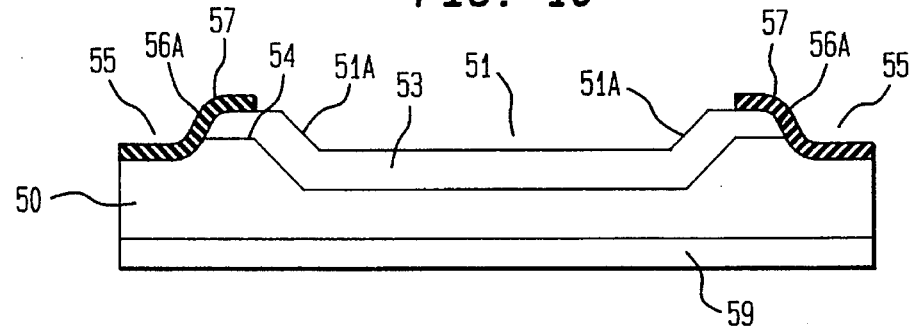

Next, as shown in FIG. 10, another diffusion is used this time with an acceptor impurity to form the diffused layer 59 (a contact layer) of lowered p-type resistivity on the bottom (back) surface of the wafer 50. There remains to dice the wafer 50 into individual chips, if many chips are being made from the wafer 50, as is shown in FIG. 9, by dicing the wafer 50 at the region of the moat 55, either before or after the formation of a passivating layer 57. Finally, as is shown in FIG. 2, conductive layers 16A and 16B are provided on the top and bottom diffused layers 13 and 15 (corresponding to layer 53 and 59 of FIG. 9), respectively, to form the chip 20. In particular, each figure includes a silicon diode with a mesa structure characterized by a depressed central portion and a rectifying junction that follows the contour of the depression and terminates on the side walls of the mesa.

The details of the various processing steps and the dimensions of the various regions are within the skill of the worker in the art and the specifics are dependent on the application to be made of the devices.

In particular, the depth of the central depression 51, the starting wafer resistivity, the depth and concentration of the diffused layer 53 and its diffusion profile are selected to achieve electrical breakdown of the p-n junction by punch through in the central region of the junction 14. As previously discussed, the depth of the moat to form the mesa should be enough deeper than the p-n junction depth that the breakdown voltage of the junction is not affected adversely but it may otherwise be deeper, equal to, or shallower than the central depression depth.

Figure 3:
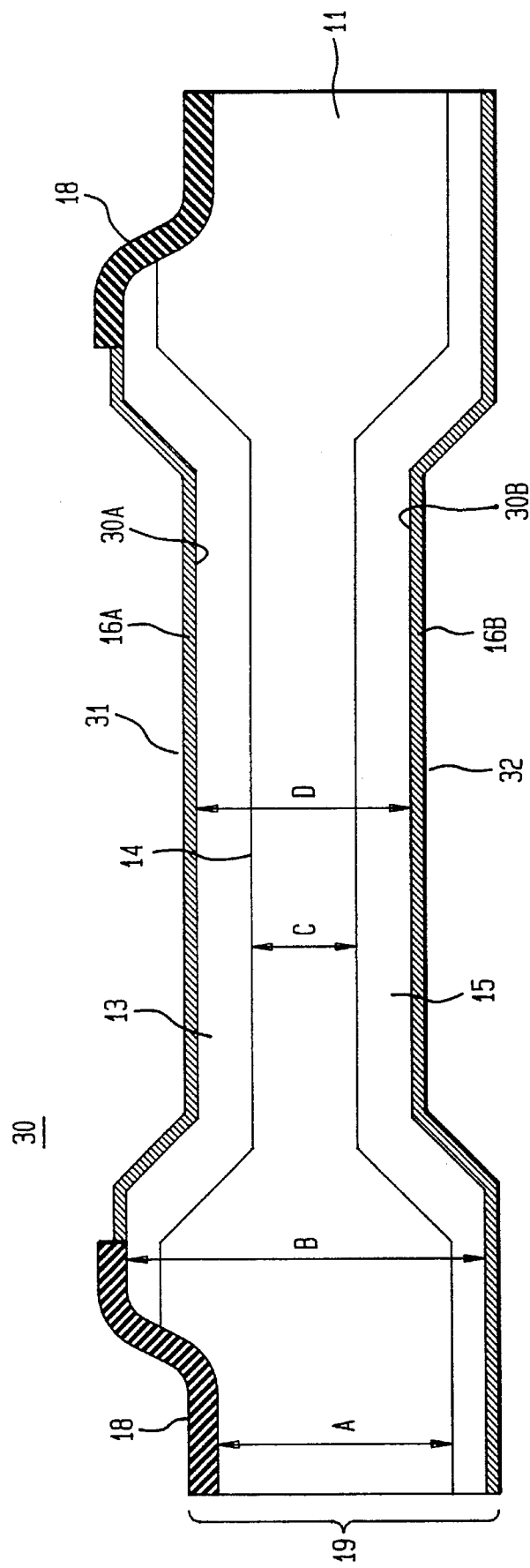
FIG. 3 shows a cross-sectional view of a device with a mesa structure that has central depressions in both its top and bottom surfaces and one p-n junction in accordance with another embodiment of the present invention.

Referring now to FIG. 3, there is shown a chip 30 in which central depressions 31 and 32 have been formed on opposite surfaces 30A and 30B, respectively, of the chip 30 before formation of diffused layers 13 and 15. Symmetric central depressions can be formed in the same etching step simply by leaving central portions of with surface 30A and 30B unmasked during the anisotropic etching step. As a consequence, both surfaces will be contoured in the manner that surface 20A was contoured in the chip 20 of FIG. 2. The chip 30 is then finished off in the manner of the chip 20 of FIG. 2 with electrical contact 16A over layer 13A and electrical contact 16B over layer 15, and separate dielectric layers 18 over portions of the bulk portion 11 and partly over the surfaces 40A and 40B. With this geometry, it becomes feasible to leave a rim portion even thicker than with the geometry of the embodiment of FIG. 2.

Figure 4:
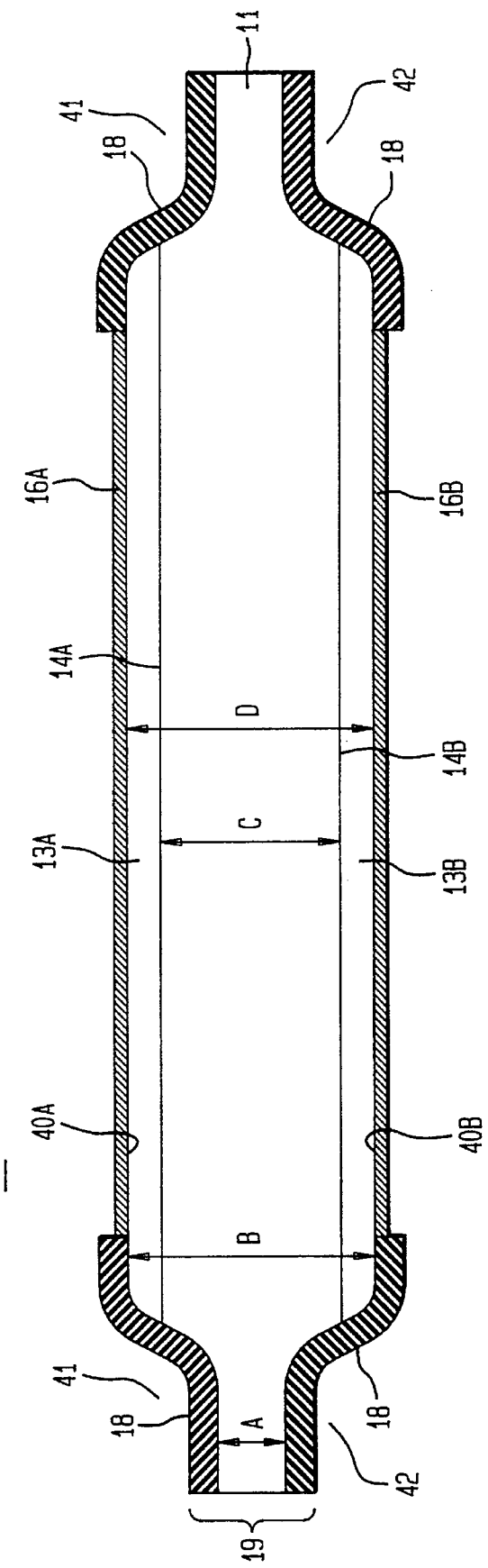
FIG. 4 shows a cross-sectional view of a prior art device with a mesa structure that has two p-n junctions.

Referring now to FIG. 4, there is shown a prior art chip 40 that includes two p-n junctions 14A and 14B in a symmetrical arrangement to form either a p-n-p or n-p-n structure depending on the choice of resistivity of the starting material. Both p-n junctions 14A and 14B can be readily formed in the same diffusion step in the bulk portion 11 in a similar manner used to form a single p-n junction in chip 10 of FIG. 1. Similarly, one etching step can be used to etch both front (top) and back (bottom) surfaces 40A and 40B, respectively, of the chip 40 to form moats 41 and 42, respectively, on surfaces 40A and 40B, respectively to leave a thinned rim 19 around the periphery of the chip 40. Layers 13A and 13B are then formed on opposite sides of the bulk portion 11. In other respects, chip 40 is processed as was chip 10 of FIG. 1 with electrode 16A on layer 13A, electrode 16B on layer 13B, and dual dielectric layers 18 with one covering a portion of bulk portion 11 and a portion of the surface 40A and the other covering a portion of bulk portion 11 and a portion of the surface 40B.

Figure 5:
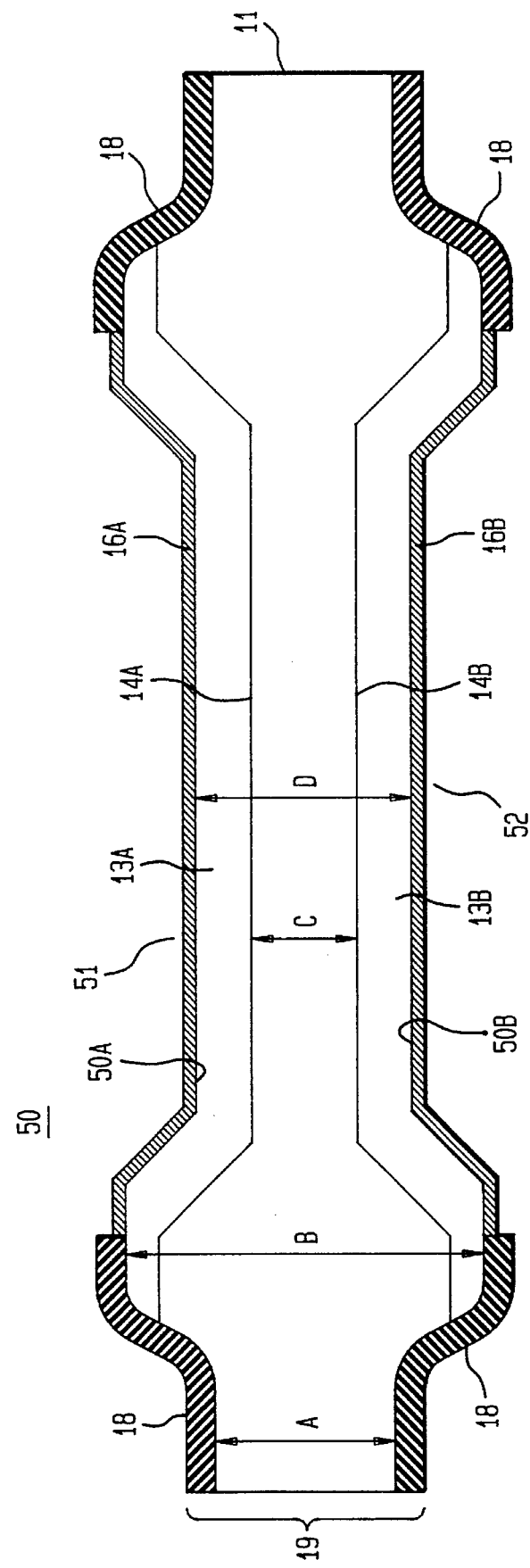
FIG. 5 shows a cross-sectional view of a device with a mesa structure that has central depressions in both its top and bottom surfaces and two p-n junctions in accordance with another embodiment of the present invention.

Referring now to FIG. 5, there is shown a chip 50 that includes two p-n junctions 14A and 14B in a symmetrical arrangement to form either a p-n-p or n-p-n structure depending on the choice of resistivity of the starting material in accordance with the present invention. Both p-n junctions 14A and 14B can be readily formed in the same diffusion step after there has been formed dual central depressions in the bulk portion 11 in a similar manner as the single central depression was formed in chip 20 of FIG. 2. Similarly, one etching step can be used to etch both front (top) and back (bottom) surfaces 50A and 50B, respectively, of the chip 50 to form moats 51 and 52, respectively, on surfaces 50A and 50B, respectively to leave a thinned rim 19 around the periphery of the chip 50. Layers 13A and 13B are then formed on opposite sides of the bulk portion 11. In other respects, chip 50 is processed as was chip 30 of FIG. 3 with electrode 16A on layer 13A, electrode 16B on layer 13B, and dual dielectric layers 18 with one covering a portion of bulk portion 11 and a portion of the surface 50A and the other covering a portion of bulk portion 11 and a portion of the surface 50B.

Moreover, the appropriate dimension of the various layers and regions will be dependent on the particular application to be made of the devices.

A better appreciation of the advantages of the embodiments of the present invention of FIGS. 2, 3, and 5 compared to the prior art embodiments of FIGS. 1 and 4 can be gained from the below Table 1. In the Table 1 there are shown typical values for different dimensions of the embodiments of FIGS. 1–5 with dimension A being the thickness of the edge of each embodiment, dimension B being the thickness of the semiconductor material, dimension C being the thickness of the respective resistive region of silicon, and dimension D being the thickness of the center region of each of the embodiments of FIGS. 2, 3, and 5 which are in accordance with the present invention. All dimensions are given in mils.

TABLE 1

| Dimensions (mils) | A | B | C | D |
|---|---|---|---|---|
| Chip 10 (Prior Art) of FIG. 1 | 6 | 10 | 6 | 10 |
| Chip 20 of FIG. 2 | 8 | 12 | 6 | 10 |
| Chip 30 of FIG. 3 | 10 | 14 | 6 | 10 |
| Chip 40 (Prior Art) of FIG. 4 | 6 | 14 | 10 | 14 |
| Chip 50 of FIG. 5 | 10 | 18 | 10 | 14 |

From Table 1 it is apparent that the A and B dimensions of novel chips 20 and 30 of FIGS. 2 and 3, respectively, are greater than the A and B dimensions of prior art chip 10 of FIG. 1., and that the A and B dimensions of novel chip 50 of FIG. 5 are greater than the A and B dimensions of prior art chip 40 of FIG. 4. Accordingly, it is apparent that the present invention permits dimensions A and B to be substantially larger without an increase in dimension C. This makes for a more rugged chip which is less susceptible to damage in its manufacture without any significant ill effect on important electrical characteristics such as series resistance which normally should be low for low loss.

In particular, it is seen that the A dimension, the thickness of the peripheral rim portion 19 of the chip, the most vulnerable portion, has been increased by one-third in chip 20 and by two-thirds in chips 30 and 50 as compared to the prior art chips 10 and 40 without any increase in the C and D dimensions that largely determine the series resistance of the chip.

Accordingly, as used herein, a depression which corresponds to the difference between the B and D dimensions in the single depression chip, and one-half the difference in the case of the twin depression chips, should be at least ten percent of the thickness of the initial bulk thickness of the chip.

The modifications needed in the process just described to prepare chips of the kind included in the embodiments of FIGS. 2, 3, and 5 are straightforward and have been alluded to earlier. Basically, to form the FIG. 3 embodiment, the anisotropic etching step used to form the depression 51 on the top surface is used to form at the same time a similar depression in the bottom surface, by leaving central portions of both the back surface the front surface unmasked during the etching step used to form the depression. Additionally, for the embodiment of FIG. 5, the second rectifying junction can be formed by the same diffusion step used to form the first rectifying junction to form a symmetric n-p-n device. In this case there is omitted the diffusion step that forms the diffused layer 15 of the same conductivity type as the bulk portion 11. Again, by the inclusion of the central depressions, it is feasible to have a rim portion thicker than would otherwise have been the case.

It can be appreciated that the specific embodiments described are merely illustrative of the basic principles involved and that various modifications can be made thereto without departing from the spirit of the invention. For example, while the invention has been described with reference to silicon as the semiconductor, the principles are applicable to other semiconductors. Still further, while the rectifying junction has been described as a p-n junction, it is known to form junctions between layers of different resistivities to achieve some asymmetric properties.

What is claimed is:

1. A semiconductive device comprising:

a semiconductive chip that includes a bulk portion of a first conductivity type and a mesa portion on a front portion of the bulk portion;

the mesa portion including a central depressed region of a first thickness and a peripheral portion of a second greater thickness;

a first diffused layer in the mesa portion that follows essentially the contour of the front surface of the mesa portion and whose edges terminate at the side walls of the mesa portion.

2. The semiconductive device of claim 1 characterized in that the first diffused layer is of the opposite conductivity type of the bulk portion and forms a p-n junction with the bulk portion.

3. The semiconductive device of claim 2 further comprising a second diffused layer in a back surface of the bulk portion, and separate electrode connections to the first and second diffused layers.

4. The semiconductive device of claim 3 further comprising a passivating layer extending over the side walls of the mesa portion.

5. A semiconductive device that comprises a semiconductive chip having a front and a back surface, and a bulk portion at the back surface and a mesa portion at the front surface, the front and back surfaces each including a central depression, and a diffused layer at the front surface forming a p-n junction that follows essentially the contour of the top surface and whose edges terminate on the side walls of the mesa portion.

6. The semiconductive device of claim 5 further characterized in that a diffused layer extends over the back surface, and separate electrode connections are provided on said front and back surfaces.

7. A semiconductive device comprising a semiconductive chip having a central bulk portion and mesa portions on the front and back surfaces of said central bulk portion with central depressions in the front and back surfaces, first and second diffused layers on the surfaces of said mesa portions, and separate electrode connections to said first and second diffused layers.

8. The semiconductive device of claim 7 in which each of the diffused layers form a p-n junction with the bulk portion.

\* \* \* \* \*